(12) United States Patent
Chu

(10) Patent No.: US 7,106,459 B2
(45) Date of Patent: *Sep. 12, 2006

(54) CD METROLOGY ANALYSIS USING A FINITE DIFFERENCE METHOD

(75) Inventor: Hanyou Chu, San Jose, CA (US)

(73) Assignee: Therma-Wave, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/150,003

(22) Filed: Jun. 10, 2005

(65) Prior Publication Data

US 2005/0231737 A1 Oct. 20, 2005

Related U.S. Application Data

(63) Continuation of application No. 10/345,814, filed on Jan. 16, 2003, now Pat. No. 6,919,964.

(60) Provisional application No. 60/394,542, filed on Jul. 9, 2002.

(51) Int. Cl.
*G01B 11/00* (2006.01)
(52) U.S. Cl. ............... 356/625; 356/601; 702/155
(58) Field of Classification Search ........... 356/601, 356/628, 636, 625; 438/16; 702/155; 257/E21.53
See application file for complete search history.

(56) References Cited

U.S. PATENT DOCUMENTS

| | | | |
|---|---|---|---|
| 5,164,790 A | 11/1992 | McNeil et al. | 356/496 |
| 5,607,800 A | 3/1997 | Ziger | 430/8 |
| 5,739,909 A | 4/1998 | Blayo et al. | 356/369 |
| 5,867,276 A | 2/1999 | McNeil et al. | 356/445 |
| 5,963,329 A | 10/1999 | Conrad et al. | 356/372 |
| 6,429,943 B1 | 8/2002 | Opsal et al. | 356/625 |
| 6,483,580 B1 | 11/2002 | Xu et al. | 356/300 |
| 6,704,661 B1 | 3/2004 | Opsal et al. | 702/27 |
| 6,768,967 B1 | 7/2004 | Johnson et al. | 702/179 |
| 6,867,866 B1 | 3/2005 | Chang et al. | 356/446 |
| 6,891,626 B1 | 5/2005 | Niu et al. | 356/625 |
| 6,919,964 B1 * | 7/2005 | Chu | 356/601 |

OTHER PUBLICATIONS

M.G. Moharam et al., "Formulation for stable and efficient implementation of the rigorous coupled-wave analysis binary gratings," *J. Opt. Soc. Am. A*, vol. 12, No. 5, May 1995, pp. 1068-1076.

* cited by examiner

*Primary Examiner*—Richard A. Rosenberger
(74) *Attorney, Agent, or Firm*—Stallman & Pollock LLP

(57) ABSTRACT

A method for modeling diffraction includes constructing a theoretical model of the subject. A numerical method is then used to predict the output field that is created when an incident field is diffracted by the subject. The numerical method begins by computing the output field at the upper boundary of the substrate and then iterates upward through each of the subject's layers. Structurally simple layers are evaluated directly. More complex layers are discretized into slices. A finite difference scheme is performed for these layers using a recursive expansion of the field-current ratio that starts (or has a base case) at the lowermost slice. The combined evaluation, through all layers, creates a scattering matrix that is evaluated to determine the output field for the subject.

14 Claims, 3 Drawing Sheets

CD METROLOGY ANALYSIS USING A FINITE DIFFERENCE METHOD

PRIORITY CLAIM

This is a continuation of U.S. patent application Ser. No. 10/345,814, filed Jan. 16, 2003, now U.S. Pat. No. 6,919,964 which in turned claims priority to U.S. Provisional Patent Application Ser. No. 60/394,542, filed Jul. 9, 2002, the disclosure of which is incorporated herein by reference.

TECHNICAL FIELD

The subject invention relates to a technique for numerically determining the scattering response of a periodic structure using a finite difference approach.

BACKGROUND OF THE INVENTION

Over the past several years, there has been considerable interest in using optical scatterometry (i.e., optical diffraction) to perform critical dimension (CD) measurements of the lines and structures included in integrated circuits. Optical scatterometry has been used to analyze periodic two-dimensional structures (e.g., line gratings) as well as three-dimensional structures (e.g., patterns of vias or mesas). Scatterometry is also used to perform overlay registration measurements. Overlay measurements attempt to measure the degree of alignment between successive lithographic mask layers.

Various optical techniques have been used to perform optical scatterometry. These techniques include broadband scatterometry (U.S. Pat. Nos. 5,607,800; 5,867,276 and 5,963,329), spectral ellipsometry (U.S. Pat. No. 5,739,909) as well as spectral and single-wavelength beam profile reflectance and beam profile ellipsometry (U.S. Pat. No. 6,429,943). In addition it may be possible to employ single-wavelength laser BPR or BPE to obtain CD measurements on isolated lines or isolated vias and mesas.

Most scatterometry systems use a modeling approach to transform scatterometry signals into critical dimension measurements. For this type of approach, a theoretical model is defined for each physical structure that will be analyzed. A series of calculations are then performed to predict the empirical measurements (optical diffraction) that scatterometry systems would record for the structure. The theoretical results of this calculation are then compared to the measured data (actually, the normalized data). To the extent the results do not match, the theoretical model is modified and the theoretical data is calculated once again and compared to the empirical measurements. This process is repeated iteratively until the correspondence between the calculated theoretical data and the empirical measurements reaches an acceptable level of fitness. At this point, the characteristics of the theoretical model and the physical structure should be very similar.

The most common technique for calculating optical diffraction for scatterometry models is known as rigorous coupled wave analysis, or RCWA. For RCWA, the diffraction associated with a model is calculated by finding solutions to Maxwell's equations for: 1) the incident electromagnetic field, the electromagnetic field within the model, and 3) the output or resulting electromagnetic field. The solutions are obtained by expanding the fields in terms of exact solutions in each region. The coefficients are obtained by requiring that the transverse electric and magnetic fields be continuous (modal matching). Unfortunately, the exact solutions require repeated matrix diagonalizations in each region in addition to few other matrix operations. Computationally, matrix diagonalization is exceedingly slow, generally more than ten times slower than other matrix operations such as matrix-matrix multiplications or matrix inversions. As a result, RCWA tends to be slow, especially for materials with complex dielectric constants. As the models become more complex (particularly as the profiles of the walls of the features become more complex) the calculations become exceedingly long and complex. Even with high-speed processors, real time evaluation of these calculations can be difficult. Analysis on a real time basis is very desirable so that manufacturers can immediately determine when a process is not operating correctly. The need is becoming more acute as the industry moves towards integrated metrology solutions wherein the metrology hardware is integrated directly with the process hardware.

A number of approaches have been developed to overcome the calculation bottleneck associated with the analysis of scatterometry results. Many of these approaches have involved techniques for improving calculation throughput, such as parallel processing techniques. An approach of this type is described in U.S. Pat. No. 6,704,661, (incorporated herein by reference) which describes distribution of scatterometry calculations among a group of parallel processors. In the preferred embodiment, the processor configuration includes a master processor and a plurality of slave processors. The master processor handles the control and the comparison functions. The calculation of the response of the theoretical sample to the interaction with the optical probe radiation is distributed by the master processor to itself and the slave processors.

For example, where the data is taken as a function of wavelength, the calculations are distributed as a function of wavelength. Thus, a first slave processor will use Maxwell's equations to determine the expected intensity of light at selected ones of the measured wavelengths scattered from a given theoretical model. The other slave processors will carry out the same calculations at different wavelengths. Assuming there are five processors (one master and four slaves) and fifty wavelengths, each processor will perform ten such calculations per iteration.

Once the calculations are complete, the master processor performs the best-fit comparison between each of the calculated intensities and the measured normalized intensities. Based on this fit, the master processor will modify the parameters of the model as discussed above (changing the widths or layer thickness). The master processor will then distribute the calculations for the modified model to the slave processors. This sequence is repeated until a good fit is achieved.

This distributed processing approach can also be used with multiple angle of incidence information. In this situation, the calculations at each of the different angles of incidence can be distributed to the slave processor. Techniques of this type are an effective method for reducing the time required for scatterometry calculations. At the same time, the speedup provided by parallel processing is strictly dependent on the availability (and associated cost) of multiple processors. Amdahl's law also limits the amount of speedup available by parallel processing since serial program portions are not improved. At the present time, neither cost nor ultimate speed improvement is a serious limitation for parallel processing techniques. As geometries continue to shrink, however it becomes increasingly possible that computational complexity will outstrip the use of parallel techniques alone.

Another approach is to use pre-computed libraries of predicted measurements. This type of approach is discussed in (U.S. Pat. No. 6,483,580) as well as the references cited therein. In this approach, the theoretical model is parameterized to allow the characteristics of the physical structure to be varied. The parameters are varied over a predetermined range and the theoretical result for each variation to the physical structure is calculated to define a library of solutions. When the empirical measurements are obtained, the library is searched to find the best fit.

The use of libraries speeds up the analysis process by allowing theoretical results to be computed once and reused many times. At the same time, library use does not completely solve the calculation bottleneck. Construction of libraries is time consuming, requiring repeated evaluation of the same time consuming theoretical models. Process changes and other variables may require periodic library modification or replacement at the cost of still more calculations. For these reasons, libraries are expensive (in computational terms) to build and to maintain. Libraries are also necessarily limited in their resolution and can contain only a finite number of theoretical results. As a result, there are many cases where empirical measurements do not have exact library matches. One approach for dealing with this problem is to generate additional theoretical results in real time to augment the theoretical results already present in the library. This combined approach improves accuracy, but slows the scatterometry process as theoretical models are evaluated in real time. A similar approach is to use a library as a starting point and apply an interpolation approach to generate missing results. This approach avoids the penalty associated with generating results in real time, but sacrifices accuracy during the interpolation process. See U.S. Pat. No. 6,768,967, incorporated herein by reference.

For these reasons and others, there is a continuing need for faster methods for computing theoretical results for scatterometry systems. This is true both for systems that use real time evaluation of theoretical models as well as systems that use library based problem solving. The need for faster evaluation methods will almost certainly increase as models become more detailed to more accurately reflect physical structures.

SUMMARY OF THE INVENTION

The following presents a simplified summary of the invention in order to provide a basic understanding of some of its aspects. This summary is not an extensive overview of the invention and is intended neither to identify key or critical elements of the invention nor to delineate its scope. The primary purpose of this summary is to present some concepts of the invention in a simplified form as a prelude to the more detailed description that is presented later.

The present invention provides a method for modeling optical diffraction. The modeling method is intended to be used in combination with a wide range of subjects including semi-conductor wafers and thin films. A generic subject includes a surface structure that is covered by an incident medium that is typically air but may be vacuum, gas, liquid, or solid (such as an overlaying layer or layers). The surface structure is typically a grating formed as a periodic series of lines having a defined profile, width and spacing. In other cases, the surface structure may be an isolated two or three-dimensional structure such as a single line or via. Below the surface structure, the subject may include one or more layers constructed using one or more different materials. At the bottom of the layers, a typical subject will include a final layer known as a substrate.

The modeling method begins with the construction of an idealized representation for the subject being modeled. A numerical method is then used to predict the output field that is created when an incident field is diffracted by the subject. The numerical method begins by computing the output field at the upper boundary of the substrate. In general, the substrate is fabricated using a uniform material. This, combined with the boundary conditions (i.e., that there are only propagating or decaying waves) allows the output field to be computed using and the uniform material that typically makes computation of the resulting output field to be computed directly.

After computation for the substrate is complete, the numerical method iterates through each of the layers in the subject. The iteration starts with the lowermost layer and continues to the grating. For layers that are structurally non-complex (e.g., uniform layers) the output field is computed directly. Non-complex layers also include grating layers that are straight with no vertical dependence and may be represented using a relatively small number of slices (e.g., five or fewer).

Layers that are structurally more complex are subdivided into a series of slices. For each layer, the output field at the upper boundary of the topmost slice is calculated using a recursive expansion of the field-current ratio that starts (or has a base case) at the lowermost slice. The combined evaluation, through all layers, creates a scattering matrix. Evaluation of the scattering matrix yields the output field for the subject.

DESCRIPTION OF THE PREFERRED EMBODIMENTS

Theoretical Foundations

Figure 1:
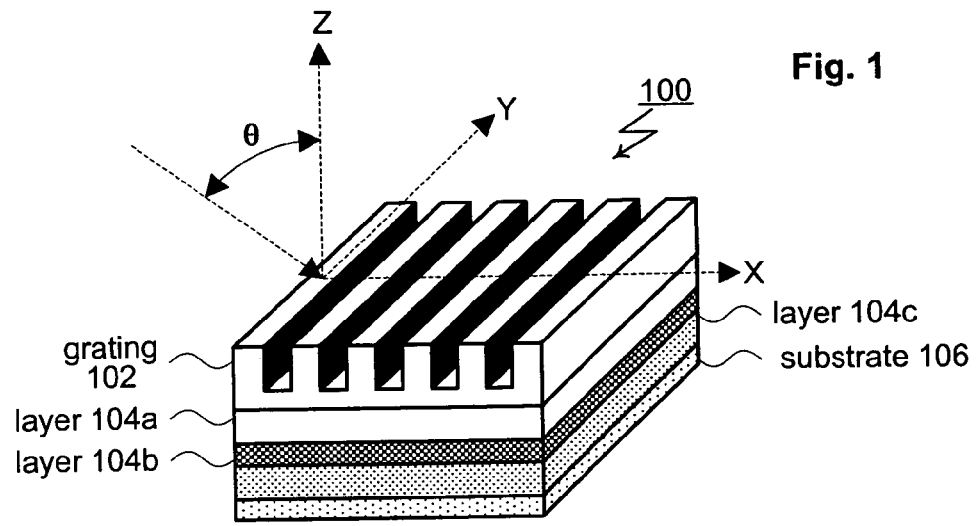
FIG. 1 shows a cross sectional representation of a generic subject for which optical diffraction may be modeled.

FIG. 1 shows a generic subject 100 of the type typically analyzed by scatterometry systems. As shown in FIG. 1, the subject 100 includes a surface structure 102. For this particular example, surface structure 102 is a grating formed as a periodic series of lines having a defined profile, width and spacing. The grating is periodic in the X direction and is uniform (exhibits translational symmetry) along the Y axis. In general, surface structure 102 may be formed as a wide range of topologies including isolated or periodic two or three-dimensional structures.

The subject 100 is covered by an incident medium (not shown) that is typically air but may be vacuum, gas, liquid, or solid (such as an overlaying layer or layers). Below the grating 102, the subject 100 may include one or more layers constructed using one or more different materials. In FIG. 1, the internal layers are labeled 104*a* through 104*c*. At the bottom of the internal layers 104, the subject 100 includes a final layer, known as a substrate 106.

For scatterometry systems, the goal is to calculate the electromagnetic diffraction that results when an incident electromagnetic field interacts with the subject 100. Cases where the subject 100 is uniform in the Y direction and the incident electromagnetic field $\psi_{in}$ is parallel to the X-Z plane are described as planer diffraction (this is the case shown in FIG. 1). Cases where the subject 100 is not uniform over Y (as is the case where the subject includes a periodic three-dimensional structure) or the incident electromagnetic field $\psi_{in}$ is not parallel to the X-Z plane are described as conical diffraction. In general, calculation of the planar case is simpler because calculation for the TE and TM modes may be performed separately. For the conical case, the TE and TM modes are coupled and must be solved simultaneously. For both the conical and planar cases, electromagnetic diffraction is calculated by finding solutions for Maxwell's equations for: 1) the incident electromagnetic field, the electromagnetic field within the subject 100, and 3) the output or resulting electromagnetic field. The solutions for the separate fields are constrained by the requirement that the TE and TM modes match at each of the interfaces between the three fields.

In cases where the electric field E(x,z) is expanded in periodic functions, or, generally speaking for a multi-component second order differential problem, the following second order differential equation applies:

$$\frac{d}{dz}\left[p(z)\frac{d}{dz}E(z)\right] = A(z)E(z). \tag{1}$$

The definition of generalized current J allows the preceding equation to be rewritten as the following first order differential equation:

$$\frac{d}{dz}\binom{\psi}{J} = aY = \begin{pmatrix} 0 & p^{-1}(z) \\ A(z) & 0 \end{pmatrix}\binom{\psi}{J} \equiv \begin{pmatrix} 0 & B(z) \\ A(z) & 0 \end{pmatrix}\binom{\psi}{J}. \tag{2}$$

In the case of planar diffraction, both TE and TM modes are well defined. For TE modes, p(z) is the identity matrix and for TM modes p(z) is the inverse dielectric function matrix, the details of which can be found, for example in M. G. Moharam, E. B. Grann, and D. A. Pommet, *Formulation for stable and efficient implementation of the rigorous coupled-wave analysis of binary gratings*, J. Opt. Soc. Am. A12, 1068(1995). For conical scattering or scattering by 3D structures, $\psi=(E_x,E_y)$, after a simple matrix rotation, this yields:

$$A = \begin{pmatrix} \hat{k}_x \varepsilon_x \hat{k}_x + \hat{k}_y \varepsilon_y \hat{k}_y & \hat{k}_y \varepsilon_y \hat{k}_x - \hat{k}_x \varepsilon_x \hat{k}_y \\ \hat{k}_x \varepsilon_y \hat{k}_y - \hat{k}_y \varepsilon_x \hat{k}_x & \hat{k}_y \varepsilon_x \hat{k}_y + \hat{k}_x \varepsilon_y \hat{k}_x - 1 \end{pmatrix}$$

$$B = \begin{pmatrix} 1 - k\varepsilon_z^{-1}k & 0 \\ 0 & 1 \end{pmatrix}$$

where $\hat{k}_x = k_x/k$ and $\hat{k}_y = k_y/k$ and $k=(k_x^2+k_y^2)^{1/2}$. It is important to observe that both A and B are symmetric. When the matrix a is real, it is a special case of a more general class of matrices that are known as Hamiltonian matrices:

$$\begin{pmatrix} D & B \\ A & -D^T \end{pmatrix}.$$

For planar diffraction, the problem of scattering can be completely formulated with the following boundary conditions. In the layer and those underneath, all layers are homogeneous so that the electric field can be written in diagonal form:

$$E_j(z) = f_j(e^{ik_jz} + r_j e^{-ik_jz})$$

$$J_j(z) = ip_j k_j f_j (e^{ik_jz} - r_j e^{-ik_jz})$$

where the $f_j$ are to be determined. The $r_j$ can be calculated using the recursion relationship for homogeneous multilayer materials. At the bottom of the grating region, the electric field can be written (in vector form) as:

$$E = (1+r)f,$$

$$J = p_L q(1-r)f = p_L q(1-r)(1+r)^{-1} E \equiv VE, \tag{3}$$

where q≡ik, r and V are diagonal matrices. Similarly, in the incident medium, the electric field can be written as:

$$J_0 = p_0 q(1-R)f_0 = p_0 q(1-R)(1+R)^{-1}E_0 = p_0 q\left(\frac{2}{1+R} - 1\right)E_0 \equiv w_0 E_0$$

where R and $w_0$ are full matrices. R is the sought after reflectivity matrix. If $w_0$ is known, R can be obtained as:

$$R = 2pq(w_0 + pq)^{-1} - 1. \tag{4}$$

For more general situations, R is obtained as:

$$R = (S^T w_0 S + q)^{-1} q - 1 = 2S^{-1}(w_0 + pSqS^{-1})^{-1} pSq - 1 \tag{5}$$

$$\psi_s = SRf_{in} = 2(w_0 + pSqS^{-1})^{-1} pSqf_{in} - Sf_{in} \tag{6}$$

$$= 2(w_0 + pSqS^{-1})^{-1} pSqS^{-1}\psi_{in} - \psi_{in} \tag{7}$$

$$= 2(w_0 + (S^{-1})^T qS^{-1})^{-1}(S^{-1})^T qS^{-1}\psi_{in} - \psi_{in} \tag{8}$$

where S is the similarity matrix that diagonalizes BA. S can be easily obtained for the incident medium.

The idea is that, the exact field at each vertical position z does not need to be known. Only the matrix ratio between the current J (H in the case of EM field) and $\psi$ (E field) needs to be known.

Initial Value Problem Solver

As will be described below, the numerical solution for the diffraction problem uses an initial value problem solver. This section describes a solver that is appropriate for this application. For this solver, Y is used as to denote the matrix ratio between the current J and $\psi$:

$$Y = \binom{\psi}{J}$$

The solution for Y at z+h in terms of the solution at z can be written as:

$$Y(z+h) = Te^{\int_z^{z+h} a(z')dz'} Y(z),$$

where T stands for time ordered product. The operator can be rewritten in terms of Magnus series as:

$$Te^{\int_z^{z+h} a(z')dz'} = e^{\Omega(z+h,z)}$$

$$\Omega(z+h, z) = \sum_j \Omega_j(z+h, z)$$

$$\Omega_1 = \int_z^{z+h} a(z')dz'$$

$$\Omega_2 = \frac{1}{2}\int_z^{z+h} dz_1 \int_z^{z+h} dz_2 [a(z_1), a(z_2)]$$

$$\ldots = \ldots$$

All higher order terms involve commutators. $\Omega(z+h,z)$ still preserves the properties of the Hamiltonian matrices where $D \neq 0$. RCWA corresponds to the following approximation:

$$\Omega(z+h,z) \approx \Omega_1(z+h,z) \approx a(z+h/2)h$$

and the matrix exponential is calculated exactly via matrix diagonalization. If a does not depend on z, this approximation is exact since all commutators become 0. Otherwise RCWA is locally second order accurate. The next order involves both first order and second order derivatives. Hence an adaptive grid size can help the accuracy of the scheme. The evaluation of the operator $e^\Omega$ requires a diagonalization of $\Omega$, which is numerically expensive. In addition, a straightforward evaluation of the matrix exponential can be numerically divergent due to exponentially growing and decaying components. As pointed out earlier, the crucial observation is that it is sufficient to know the ratio between J and $\psi$. As a matter of fact if the matrix BA can be diagonalized as:

$$BA = S\Lambda S^{-1} \equiv Sq^2 S^{-1},$$

where $\Lambda$ is diagonal and S is so normalized such that $S^T DS = 1$, and if $J(z) = w(z)\psi(z)$, it can be shown that:

$$w(z-d) = (S^{-1})^T \left\{ \left[\frac{1-e^{qd}}{2q} + e^{qd}(q + S^T w(z)S)^{-1} e^{qd}\right]^{-1} - q \right\} S^{-1}. \quad (9)$$

Matrix diagonalization is usually more than ten times slower than matrix-matrix multiplications. As a result, it is worth examining other alternatives. However, there are three problems one has to deal with: 1. local accuracy, 2. global numerical instability that is the result of numerical procedures, and 3. inherent global instability. As mentioned earlier, RCWA is second order accurate if a(z) depends on z and it insures good numerical stability as a result of exact numerical diagonalizations. The third problem is common to all schemes. Even if $e^\Omega$ can be evaluated exactly, the instability problem remains. This is when the scaling between J and $\psi$ comes into play.

Global stability is more important than local accuracy because a scheme with global instability can render the final results useless, regardless how good the local accuracy is. One example is the explicit classical Runge-Kutta method. The following section describes two alternatives to the RCWA matrix diagonalization approach.

Central Difference Scheme

For the central difference scheme, each layer in the subject 100 is divided into N equally spaced segments of height h. The field $\psi$ for each segment is denoted: $\psi_n = \psi(nh)$. The field is located at end points and J located at center points (or vice versa). As a result of the discretization:

$$\psi_{n-1} = \psi_n - B_{n-1/2} J_{n-1/2} \quad (10)$$

$$J_{n-1/2} = J_{n+1/2} - A_n \psi_n$$

$$\begin{pmatrix} \psi_{n-1} \\ J_{n-1/2} \end{pmatrix} = \begin{pmatrix} 1 & -B_{n-1/2} \\ 0 & 1 \end{pmatrix} \begin{pmatrix} 1 & 0 \\ -A_n & 1 \end{pmatrix} \begin{pmatrix} \psi_n \\ J_{n+1/2} \end{pmatrix}$$

$$B_{n+1/2} \equiv p^{-1}(z_{n+1/2})h$$

$$A_n \equiv A(z_n)/h.$$

A simple scheme is to use this relation recursively. In general this does not work because the resulting matrix eventually diverges. To overcome this instability, the definition $J_{n+1/2} \equiv w_n \psi_n$ is used to produce the following equation:

$$w_{n-1} = ((w_n - A_n)^{-1} - B_{n-1/2})^{-1} = B_{n-1/2}^{-1} + B_{n-1/2}^{-1}(w_n - A_n - B_{n-1/2}^{-1})^{-1} B_{n-1/2}^{-1}. \quad (11)$$

Compared to Equation (10), Equation (11) is more numerically efficient if $w_n$ is symmetric. For TE modes, B is diagonal and its inverse is trivial. For TM modes, p is evaluated and B is calculated as the inverse of p. For non-planar diffraction, B (which is blockwise diagonal) is evaluated and then inverted. For the non-planar case, Equation (11) is only marginally faster than Equation (10).

An equivalent formulation is to eliminate J so that:

$$p(z+h/2)(\psi(z+h)-\psi(z))+p(z-h/2)(\psi(z-h)-\psi(z))=A(z)h^2\psi(z).$$

By defining the scaling $\psi(z+h)=W(z)\psi(z)$, the following recursion is obtained:

$$W(z-h) = [\overline{A}(z) + p^- + p^+ - p^+ W(z)]^{-1} p^- \quad (12)$$

where:

$$p^\pm \equiv p(z\pm h)/h, \quad \overline{A} \equiv A(z)h.$$

The exercise of this is to show that such a scheme is equivalent to the LU factorization of the block tridiagonal matrix that will be proven later.

For notational convenience, here and after p denotes p/h, A denotes Ah, and B denotes Bh. To treat boundaries efficiently a second order accurate scheme such as the following is used:

$$Y_{n-1/2} \approx e^{-\frac{h}{2}a(n-1/4)} Y_n \approx \begin{pmatrix} 1 + \frac{1}{2}BA & -B \\ -A & 1 + \frac{1}{2}AB \end{pmatrix} Y_n \quad (13)$$

$$w_{n-1/2} = -A + \left(1 + \frac{1}{2}AB\right) w_n$$

$$Y_{1/2} \approx e^{\frac{h}{2}a(1/4)} Y_0, \quad J_{1/2} = A + \left(1 + \frac{1}{2}AB\right) w_0$$

$$w_0 = \left(1 + \frac{1}{2}AB\right)^{-1}(J_{1/2} - A) \quad (14)$$
$$\approx \left(1 - \frac{1}{2}AB\right)(J_{1/2} - A)$$
$$\approx -A + \left(1 - \frac{1}{2}AB\right)w_{1/2}$$

Ignoring AB is first order accurate at the boundary. The resulting w is symmetric which can make the algorithm almost twice as fast. With AB included, the results are generally better even if w is forced to be symmetric.

Operator Splitting

Starting from the equation $Y_{n-1} = e^{-\Omega h}Y_n$, it is possible to use Strang splitting which is second order accurate:

$$a \equiv \begin{pmatrix} 0 & 0 \\ A & 0 \end{pmatrix}, \quad b \equiv \begin{pmatrix} 0 & B \\ 0 & 0 \end{pmatrix}$$

$$e^{-(a+b)} \approx e^{-\frac{1}{2}b}e^{-a}e^{-\frac{1}{2}b}$$
$$= \begin{pmatrix} 1 & -\frac{1}{2}B \\ 0 & 1 \end{pmatrix}\begin{pmatrix} 1 & 0 \\ -A & 1 \end{pmatrix}\begin{pmatrix} 1 & -\frac{1}{2}B \\ 0 & 1 \end{pmatrix}$$

$$e^{-(a+b)} \approx e^{-\frac{1}{2}a}e^{-b}e^{-\frac{1}{2}a}$$
$$= \begin{pmatrix} 1 & 0 \\ -\frac{1}{2}A & 1 \end{pmatrix}\begin{pmatrix} 1 & -B \\ 0 & 1 \end{pmatrix}\begin{pmatrix} 1 & 0 \\ -\frac{1}{2}A & 1 \end{pmatrix}$$

Hence with the use of the second formula, the recursion relation for w is:

$$w = ((w - A/2)^{-1} - B)^{-1} - A/2. \quad (15)$$

where both A and B are evaluated at center points. This recursion can be also written as $w = p(p + A/2 - w)^{-1} - p - A/2$. This recursion is very similar to the one obtained for the central difference scheme.

This is also called the leap frog method. It works reasonably well compared to other schemes such as Runge-Kutta, but not as good as the central difference scheme described in the previous section. Part of the reason is that the splitting is not symmetric in terms of A and B.

Block Tridiagonal UL(LU) Algorithm

Starting with a matrix of the following form:

$$A = \begin{pmatrix} a_1 & b_1 & & & & \\ c_2 & a_2 & b_2 & & & \\ & c_3 & a_3 & b_3 & & \\ & & \cdot & \cdot & \cdot & \\ & & & \cdot & \cdot & \cdot \\ & & & & c_{n-1} & a_{n-1} & b_{n-1} \\ & & & & & c_n & a_n \end{pmatrix}$$

with the right hand side $Y = \begin{pmatrix} y_1 \\ 0 \\ 0 \\ 0 \\ 0 \\ 0 \\ 0 \end{pmatrix}$ It is possible to decompose A=UL, with:

$$U = \begin{pmatrix} 1 & u_1 & & & & & \\ & 1 & u_2 & & & & \\ & 0 & 1 & u_3 & & & \\ & & 0 & \cdot & \cdot & & \\ & & & 0 & \cdot & \cdot & \\ & & & & 0 & 1 & u_{n-1} \\ & & & & & 0 & 1 \end{pmatrix} \text{ and}$$

$$L = \begin{pmatrix} d_1 & & & & & \\ c_2 & d_2 & & & & \\ & c_3 & d_3 & & & \\ & & \cdot & \cdot & & \\ & & & \cdot & \cdot & \\ & & & & c_{n-1} & d_{n-1} \\ & & & & & c_n & d_n \end{pmatrix}$$

This produces the relations:

$$d_n = a_n$$
$$u_{i+1} = b_i d_{i+1}^{-1}$$
$$d_i = a_i - b_i d_{i+1}^{-1} c_{i+1}$$

Defining $w_i = d_i^{-1} c_i$ results in:

$$w_i = (a_i - b_i w_{i+1})^{-1} c_i. \quad (16)$$

then:

$$L = \text{diag}(d)\begin{pmatrix} 1 & & & & & \\ w_2 & 1 & & & & \\ & w_3 & 1 & & & \\ & & \cdot & \cdot & & \\ & & & \cdot & \cdot & \\ & & & & w_{n-1} & 1 \\ & & & & & w_n & 1 \end{pmatrix}$$

The advantage of this approach is that it is sufficient to solve Lx=y. This is due to the special structure of y where $U^{-1}y = y$. Since it is sufficient to know the ratio between $x_1$ and $x_2$, there is no need to keep $w_i$ and $d_i$.

Comparing Equation (12) and Equation (16) shows that the scaling algorithm described previously (see discussion of the initial value problem solver) is equivalent to the UL algorithm.

Numerical Procedures for Computing Diffraction

Figure 2:
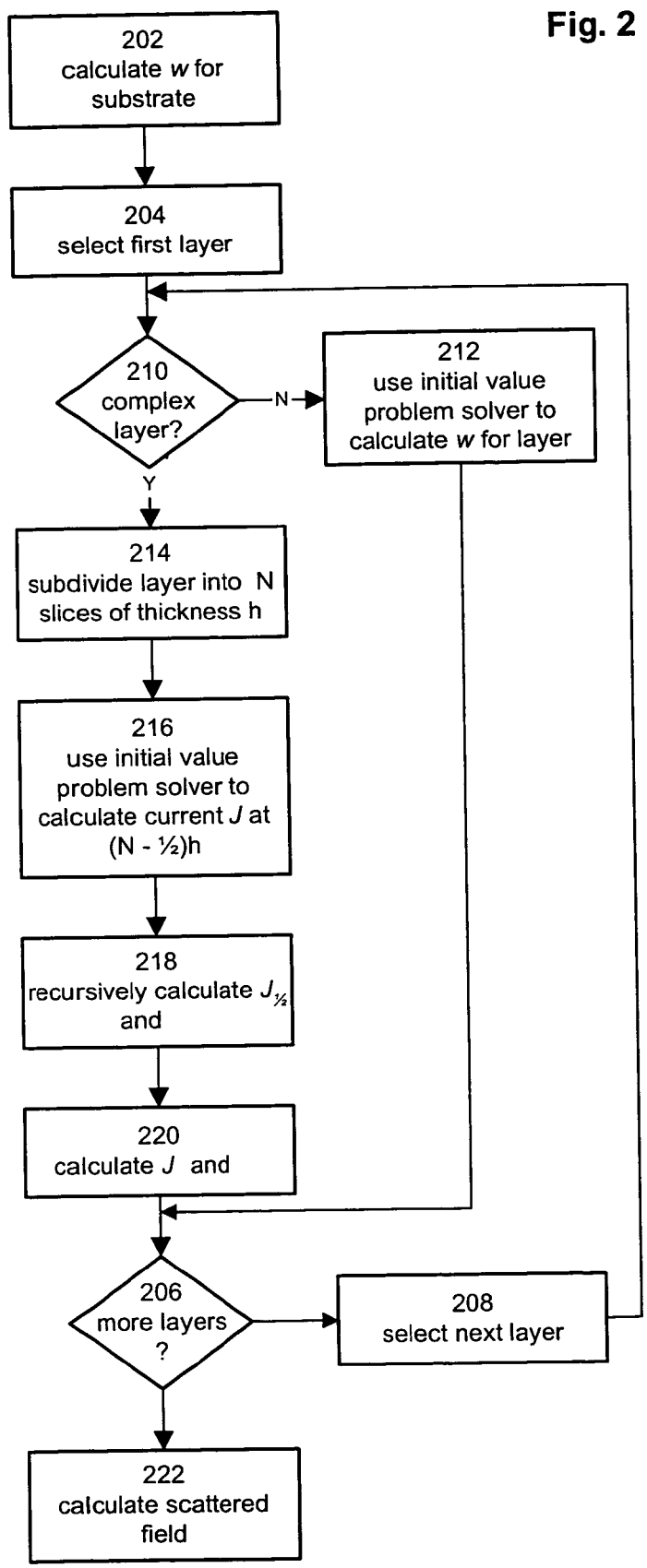
FIG. 2 is a flowchart showing the steps associated with a first method for modeling optical scattering as provided by an embodiment of the present invention.

As shown in FIG. 2, the numerical method for computing diffraction for the subject 100 begins by computing w for the substrate 106 (see step 202). To compute w, BA is diagonalized such that $BA=S\Lambda S^{-1}$. The boundary conditions require that there are only propagating or decaying waves, with the result that:

$$w=pSqS^{-1}=(S^{-1})^T qS^{-1}. \quad (17)$$

In general, the substrate 106 is constructed of a uniform material making the diagonalization process trivial and S is diagonal.

After computation for the substrate is complete, the numerical method iterates through each of the remaining layers in the subject 100. The iteration starts with the lowermost layer 104c and continues through the grating 102. In FIG. 2, this iteration is controlled by a loop structure formed by steps 204, 206 and 208. In general, this particular combination of steps is not required and any suitable iterative control structure may be used.

Within the loop of steps 204 through 208, the numerical method assesses the complexity of each layer (see step 210). For layers that are structurally non-complex, Equation (9) is used to obtain a value for w at the layer's upper boundary (see step 212). Layers of this type include uniform layers. Non-complex layers also include grating layers that are straight with no z dependence that may be represented using a relatively small number of slices (e.g., five or fewer).

Layers that are structurally more complex are subdivided into a series of N slices. Each slice has thickness h (see step 214, variable step size can be achieved by a variable transformation). Equation (13) is used along with any initial value solver to obtain the current midway through the lowermost slice (i.e., at $(N-½)h$) (see step 216).

Equation (11) is then used recursively through the slices to the top of the layer to obtain the ratio between $J_{1/2}$ and $\psi_0$ (see step 218). Equation (14) and an initial solver are then used to obtain the ratio between $J_0$ and $\psi_0$ (see step 220).

After calculating $J_0$ and $\omega_0$ for each layer, Equation (8) is used to obtain the scattered field for the subject 100 (see step 222).

Figure 3:
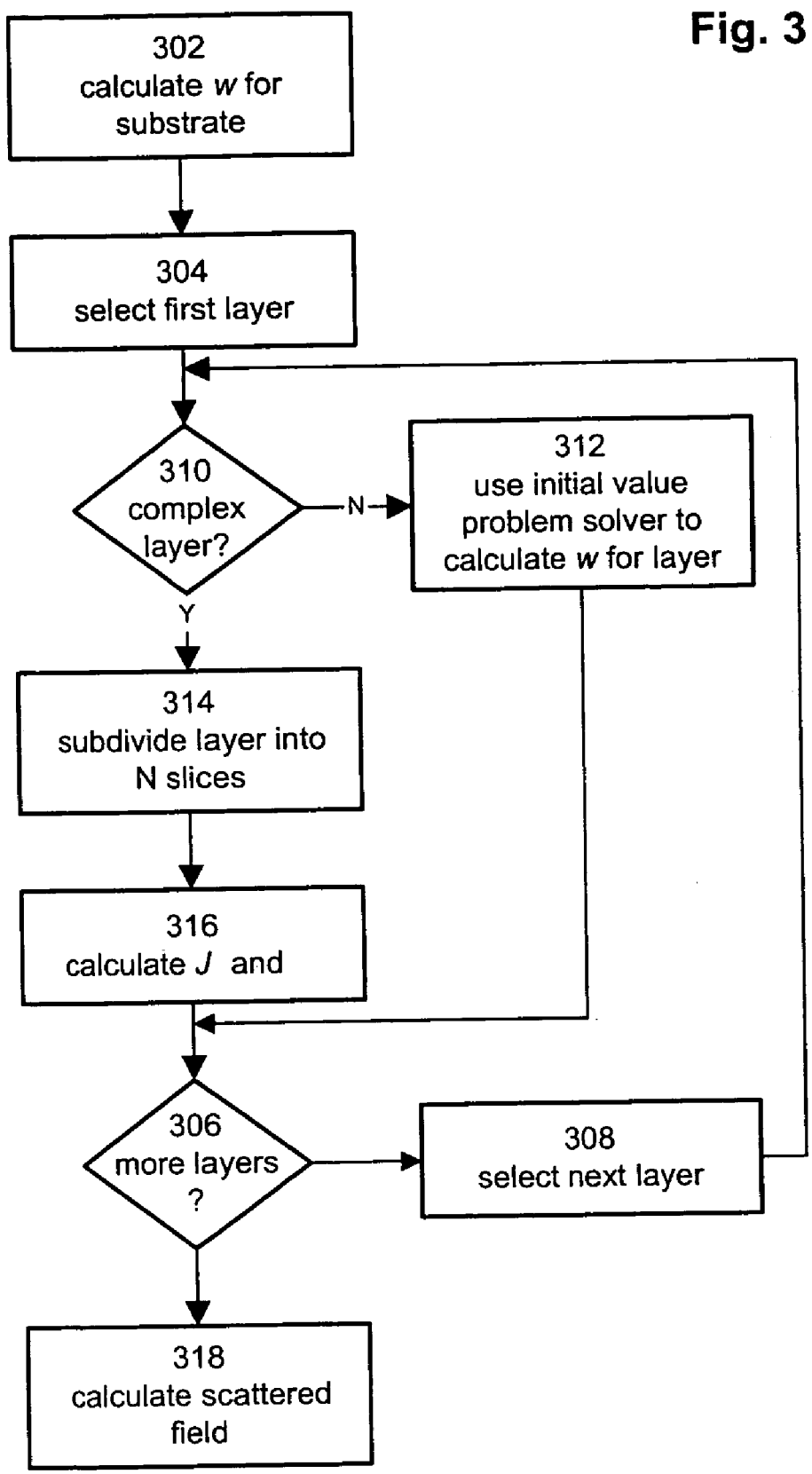
FIG. 3 is a flowchart showing the steps associated with a second method for modeling optical scattering as provided by an embodiment of the present invention.

FIG. 3 shows a variation of the just-described numerical method for computing diffraction. As may be appreciated by comparison of FIGS. 2 and 3, the variation differs because the N slices of each layer are no longer required to have the same thickness (compare steps 212 and 314). This allows each layer to be sliced adaptively, putting more slices in the areas that are the least uniform. The ability to slice adaptively is accomplished by using Equation (15) (or other operator splitting scheme) to compute w for each layer during the iteration process (compare steps 216 through 220 to step 316). This can be viewed as a simple replacement for the diagonalization procedure RCWA.

In general, any descretization scheme may be used for the numerical method. Suitable candidates are the so called multi-step backward difference formulas used to solve stiff differential equations. Typically, these methods involve more matrix manipulations and are not symmetric in up and down directions. For TE modes a fourth order Numerov method may be used. As a matter of fact when the A and B are independent of the variable z, the only difference between the central difference and operator splitting is near the boundaries. A pseudo Numerov method where p is replaced by $p-A/12$ can be used to greatly enhance the accuracy of the operator splitting method, reducing the number of slices required significantly, even surpassing the central difference method.

Representative Application

Figure 4:
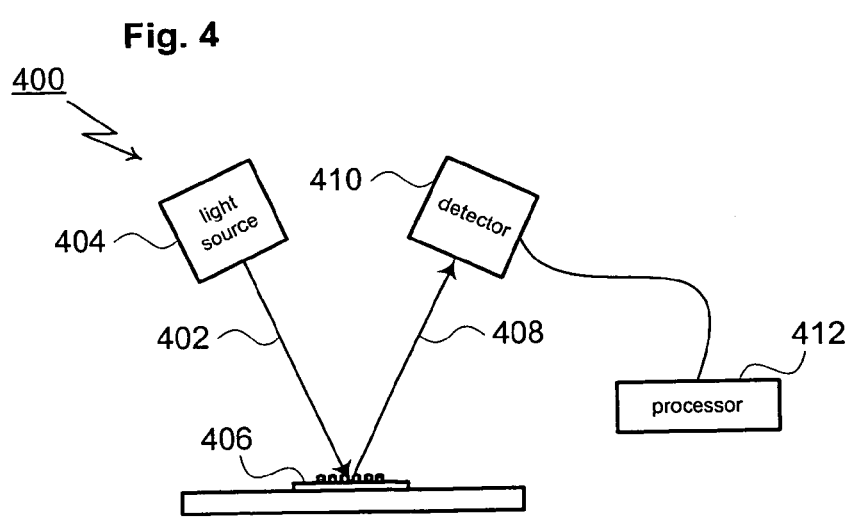
FIG. 4 is a block diagram of an optical metrology system shown as a representative application for the present invention.

The numerical method and the associated derivations can be used to predict the optical scattering produced by a wide range of structures. FIG. 4 shows the elements of a scatterometer which may be used to generate empirical measurements for optical scattering. As shown in FIG. 4, the scatterometer 400 generates a probe beam 402 using an illumination source 404. Depending on the type of scatterometer 400, the illumination source 404 may be mono or polychromatic. The probe beam 402 is directed at a subject 406 to be analyzed. The subject 406 is generally of the type shown in FIG. 1. The reflected probe beam 408 is received by a detector 410. Once received, changes in reflectivity or polarization state of the probe beam are measured as a function of angle of incidence or wavelength (or both) and forwarded to processor 412.

To analyze the changes measured by detector 410, a hypothetical structure is postulated for the subject 406. The numerical method is then used to calculate one or more predicted reflection coefficients for the hypothetical structure. The hypothetical structure is then changed, and the numerical method repeated, until the predicted reflection coefficients match the results empirically observed by detector 410 (within some predetermined goodness of fit). At this point the hypothetical structure is assumed to closely match the actual structure of subject 406. In practice, the numerical method has been found to impart a high degree of efficiency to this process, allowing the analysis of results in real or near real-time. The numerical method may also be used to pre-compute results for a hypothetical structure or for a series of variations to a hypothetical structure. Typically, the pre-computing of results is used as part of a library-based approach where the measurements recorded by detector 410 are compared (at least initially) to predicted reflection coefficients that have been computed and stored ahead of time. This sort of approach may be mixed with the real-time analysis where the numerical method is used to refine an analysis initially performed using the library-based approach.

What is claimed is:

1. An apparatus for evaluating a diffracting structure associated with a sample comprising:
   a light source for generating a probe beam of radiation;
   a detector for measuring the probe beam after reflection from the sample; and
   a processor operatively connected to the detector, said processor generating an empirical reflection coefficient in response to the measurement of the probe beam, said processor for comparing the empirical reflection coefficient with a predicted reflection coefficient associated with a corresponding hypothetical structure, said predicated reflection coefficient being calculated using a finite difference analysis with the comparison being used to evaluate the diffracting structure of the sample.

2. An apparatus as recited in claim 1, wherein the processor calculates a scattering matrix for the sample by stepping in the vertical direction and evaluates the scattering matrix using matrix scaling between the output field and the associated current.

3. An apparatus as recited in claim 2, wherein the processor calculates a field-current ratio at the top of a substrate within the sample.

4. An apparatus as recited in claim 2, wherein the processor calculates the output field at the upper boundary of a uniform layer within the sample using an initial value solver.

5. An apparatus as recited in claim 1, the processor calculates a scattering matrix for the sample by stepping in the vertical direction and uses a block tridiagonal UL method to evaluate the scattering matrix.

6. An apparatus as recited in claim 5, wherein the processor calculates a field-current ratio at the top of a substrate within the sample.

7. An apparatus as recited in claim 6, wherein the processor calculates the output field at the upper boundary of a uniform layer within the sample using an initial value solver.

8. An apparatus for evaluating a diffracting structure associated with a sample comprising:
   a light source for generating a probe beam of radiation;
   a detector for measuring the probe beam after reflection from the sample; and
   a processor operatively connected to the detector, said processor generating an empirical reflection coefficient in response to the measurement of the probe beam, said processor for comparing the empirical reflection coefficient with a predicted reflection coefficient associated with a corresponding hypothetical structure, said predicated reflection coefficient being calculated using a central difference analysis with stepping in the vertical direction to calculate the output field at the upper boundary of the diffracting structure and correcting the calculated output field near the upper and lower boundaries of the diffracting structure using a current-field relationship with the comparison being used to evaluate the diffracting structure of the sample.

9. An apparatus as recited in claim 8, wherein the processor calculates a field-current ratio at the top of a substrate within the sample.

10. An apparatus as recited in claim 8, wherein the processor calculates the output field at the upper boundary of a uniform layer within the sample using an initial value solver.

11. An apparatus for evaluating a diffracting structure associated with a sample comprising:
   a light source for generating a probe beam of radiation;
   a detector for measuring the probe beam after reflection from the sample; and
   a processor operatively connected to the detector, said processor generating an empirical reflection coefficient in response to the measurement of the probe beam, said processor for comparing the empirical reflection coefficient with a predicted reflection coefficient associated with a corresponding hypothetical structure, said predicated reflection coefficient being calculated using a pseudo Numerov operator splitting method with stepping in the vertical direction to calculate a current-field ratio at the top of a slice within the sample based on the current-field ratio at the bottom of the slice to calculate a scattering matrix for the subject and evaluating the scattering matrix to evaluate the diffracting structure of the sample.

12. An apparatus as recited in claim 1 wherein the processor calculates a field-current ratio at the top of a substrate within the sample.

13. An apparatus as recited in claim 11, wherein the processor uses a block tridiagonal UL method to evaluate the scattering matrix.

14. An apparatus as recited in claim 11, wherein the processor evaluates the scattering matrix using matrix scaling between the output field and the associated current.

* * * * *